(12) United States Patent
Mirafuentes et al.

(10) Patent No.: US 11,683,047 B2
(45) Date of Patent: *Jun. 20, 2023

(54) SWITCH-MODE POWER SUPPLIES WITH IMPROVED ANALOG-TO-DIGITAL CURRENT CALIBRATION

(71) Applicant: Astec International Limited, Kowloon (HK)

(72) Inventors: CJ Saguian Mirafuentes, Malolos (PH); Ranil Margarijo Montaril, Quezon (PH)

(73) Assignee: Astec International Limited, Kowloon (HK)

( * ) Notice: Subject to any disclaimer, the term of this patent is extended or adjusted under 35 U.S.C. 154(b) by 0 days.

This patent is subject to a terminal disclaimer.

(21) Appl. No.: 17/455,543

(22) Filed: Nov. 18, 2021

(65) Prior Publication Data

US 2022/0077866 A1 Mar. 10, 2022

Related U.S. Application Data

(63) Continuation of application No. 16/800,084, filed on Feb. 25, 2020, now Pat. No. 11,206,033.

(51) Int. Cl.
  *H03M 1/10* (2006.01)
  *H02M 1/00* (2006.01)

(52) U.S. Cl.
  CPC ....... *H03M 1/1009* (2013.01); *H02M 1/0009* (2021.05); *H02M 1/0012* (2021.05)

(58) Field of Classification Search
  CPC . H03M 1/1009; H02M 1/0009; H02M 1/0012
  USPC .................................. 341/120, 155; 323/282
  See application file for complete search history.

(56) References Cited

U.S. PATENT DOCUMENTS 7,315,157 B2 * 1/2008 Chapuis ................ H02M 3/157
  323/282
10,033,272 B2 * 7/2018 Rader .................... H02M 3/156

* cited by examiner

*Primary Examiner* — Khai M Nguyen (57) ABSTRACT

A switch-mode power supply includes a pair of input terminals, a pair of output terminals, and at least one switch coupled between the input terminals and the output terminals. The power supply further includes an analog-to-digital converter (ADC) for converting a sensed analog current value at the output terminals to an output digital value, an interface for receiving a user configurable current setting, and a control circuit coupled with the interface, the ADC and the at least one switch. The control circuit is configured to determine a raw digital value of the ADC that corresponds to the received current setting by processing an iterative loop, and turn on and turn off the at least one switch according to the determined raw digital value and the output digital value of the ADC, to supply an output current at the pair of output terminals that corresponds to the received current setting.

20 Claims, 6 Drawing Sheets

SWITCH-MODE POWER SUPPLIES WITH IMPROVED ANALOG-TO-DIGITAL CURRENT CALIBRATION

CROSS-REFERENCE TO RELATED APPLICATIONS

This application claims the benefit of and priority to U.S. application Ser. No. 16/800,084 filed Feb. 258, 2020. The entire disclosure of the above application is incorporated herein by reference.

FIELD

The present disclosure relates to switch-mode power supplies with improved analog-to-digital current calibration.

BACKGROUND

This section provides background information related to the present disclosure which is not necessarily prior art.

Power supplies determine calibration settings for analog-to-digital converters (ADCs) by solving inverses of quadratic equations, using square root calculations. This may use excessive processing power and take longer than desired to solve, and may not work with low cost digital signal processors (DSPs) designed to perform operations only on integer numbers (e.g., fixed-point DSPs).

Some power supplies use a look up table method to avoid solving square root calculations, where many data points are stored defining the raw digital value of the ADC that corresponds to various current settings. However, the look up table may occupy a lot of memory space in a digital signal processor, and extra variables may be required to keep track of many data point numbers that will never be used.

SUMMARY

This section provides a general summary of the disclosure, and is not a comprehensive disclosure of its full scope or all of its features.

According to one aspect of the present disclosure, a switch-mode power supply includes a pair of input terminals for receiving an alternating current (AC) or direct current (DC) voltage input from an input power source, a pair of output terminals for supplying a direct current (DC) voltage output to a load, and at least one switch coupled between the pair of input terminals and the pair of output terminals. The power supply further includes an analog-to-digital converter (ADC) coupled to convert a sensed analog current value at the pair of output terminals to an output digital value, an interface for receiving a user configurable current setting, and a control circuit coupled with the interface, the ADC and the at least one switch. The control circuit is configured to determine a raw digital value of the ADC that corresponds to the received current setting by processing an iterative loop, and turn on and turn off the at least one switch according to the determined raw digital value and the output digital value of the ADC, to supply an output current at the pair of output terminals that corresponds to the received current setting.

According to another aspect of the present disclosure, a method of controlling a switch-mode power supply is disclosed. The power supply includes a pair of input terminals for receiving an alternating current (AC) or direct current (DC) voltage input from an input power source, a pair of output terminals for supplying a direct current (DC) voltage output to a load, at least one switch coupled between the pair of input terminals and the pair of output terminals, an analog-to-digital converter (ADC) coupled to convert a sensed analog current value at the pair of output terminals to an output digital value, and an external interface. The method includes receiving, via the external interface, a user configurable current setting, and processing an iterative loop to determine a raw digital value of the ADC that corresponds to the received current setting. The method also includes turning on and turning off the at least one switch according to the determined raw digital value and the output digital value of the ADC, to supply an output current at the pair of output terminals that corresponds to the received current setting.

Further aspects and areas of applicability will become apparent from the description provided herein. It should be understood that various aspects of this disclosure may be implemented individually or in combination with one or more other aspects. It should also be understood that the description and specific examples herein are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts or features throughout the several views of the drawings.

DETAILED DESCRIPTION

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 1:
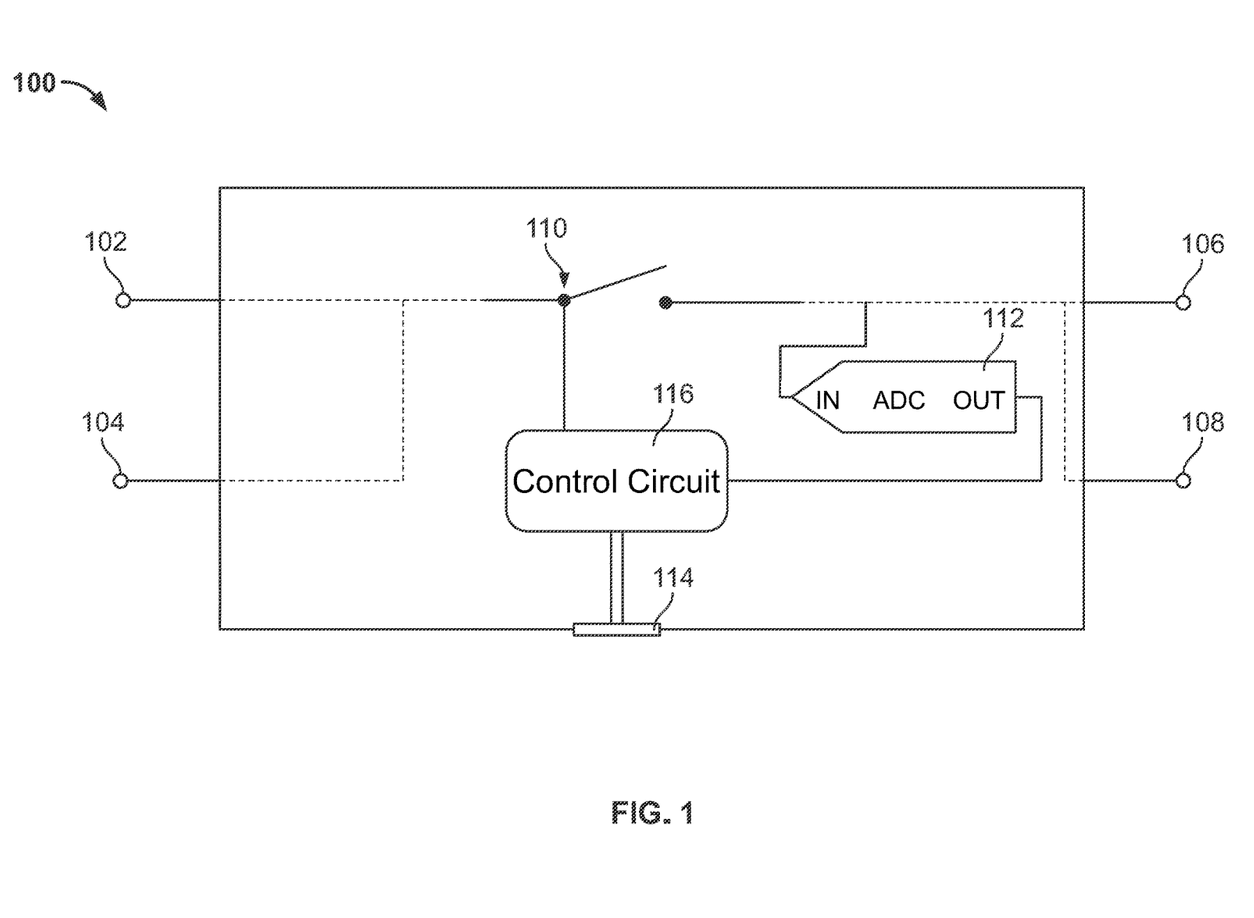
FIG. 1 is a block diagram of a switch-mode power supply, according to one example embodiment of the present disclosure.

A switch-mode power supply according to one example embodiment of the present disclosure is illustrated in FIG. 1 and indicated generally by reference number 100. The power supply 100 includes a pair of input terminals 102 and 104 for receiving an alternating current (AC) or direct current (DC) voltage input from an input power source, and a pair of output terminals 106 and 108 for supplying a direct current (DC) voltage output to a load.

The power supply 100 also includes at least one power switch 110 (e.g., FET) coupled between the pair of input terminals 102, 104 and the pair of output terminals 106, 108. The power supply 100 further includes an analog-to-digital converter (ADC) 112 for converting a sensed analog current value at the pair of output terminals 106, 108 to an output digital value, and an interface 114 (e.g., an external interface, a user interface, etc.) for receiving a user configurable current setting.

As shown in FIG. 1, a control circuit 116 is coupled with the interface 114, the ADC 112 and the at least one power switch 110. The control circuit 116 is configured to determine a raw digital value of the ADC 112 that corresponds to the received current setting by processing an iterative loop, and turn on and turn off the at least one switch 110 according to the determined raw digital value and the output digital value of the ADC 112, to supply an output current at the pair of output terminals 106, 108 that corresponds to the received current setting.

The power supply 100 may allow a user to input a desired current value setting (e.g., a constant current limit (CCL), etc.) of the power supply 100 through the interface 114, and the control circuit 116 may use an iterative loop to determine a calibrated raw digital value of the ADC 112 that corresponds to the input current value setting.

As described further below, the iterative loop may include one or more calibration equations having specified calibration coefficients. At the end of each iteration, the control circuit 116 may determine whether the determined raw digital value of the latest iteration is within an acceptable error percentage range, and if so, use the determined raw digital value of the latest iteration to set a specified current parameter of the power supply 100 that corresponds to the desired current value setting input by the user. If the determined raw digital value of the latest iteration is not within the acceptable error percentage range, the control circuit 116 may assign the latest determined raw digital value to an initial value of a next iterative loop and then process the next iterative loop.

The iterative loop approach may provide advantage(s) over processes that solve quadratic formulas to determine a raw digital value for the ADC 112, over processes that use a look up table that stores raw digital values corresponding to user input current settings, etc. For example, the iterative loop may use non-complex math functions that do not require processing a square root function to solve a quadratic formula, and may require less memory space than a look up table would otherwise occupy to store all of its data points.

The iterative loop process may allow for inverse calculation of second degree equations, n-th degree equations, etc. The iterative loop process may be desirable for implementation in low cost digital signal processors (DSPs), which may perform integer calculations. For example, the iterative loop process may allow use of control circuits that comprise fixed-point DSPs that are only capable of performing calculations on integer numbers. Further, the iterative loop process may reduce processing time with minimal error, which may free up processing needed for other features of the power supply 100.

Although FIG. 1 illustrates a single switch 110 in the power supply 100, other embodiments may include any suitable number of switches coupled in any suitable power converter topology. The dotted lines in FIG. 1 illustrate that any suitable components may be connected in any suitable arrangement between the input terminals 102, 104 and the output terminals 106, 108. For example, the power supply 100 may include any suitable resistors, transistors, capacitors, inductors, transformers, sensors, etc., which may be connected in any suitable arrangement (e.g., bridges, rectifiers, etc.). The input terminals 102, 104 and the output terminals 106, 108 may include any suitable connectors, wires, terminals, etc. for supplying power.

The control circuit 116 may include any suitable microprocessor, microcontroller, integrated circuit, digital signal processor, etc., which may include memory. The control circuit 116 may be configured to perform (e.g., operable to perform, etc.) any of the example processes described herein using any suitable hardware and/or software implementation. For example, the control circuit 116 may execute computer-executable instructions stored in a memory, may include one or more logic gates, control circuitry, etc.

Figure 2:
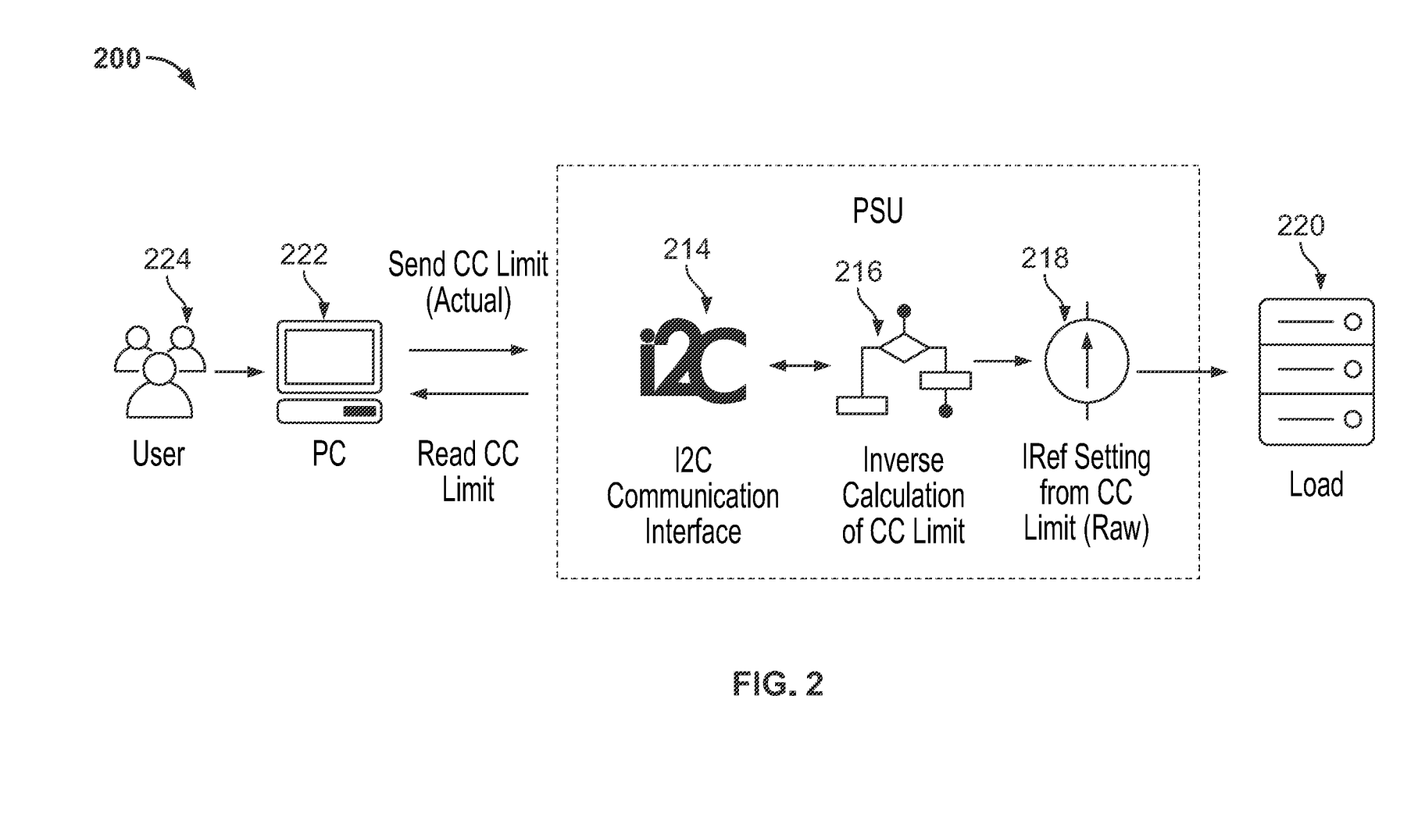
FIG. 2 is a block diagram of a system for supplying a user configurable current setting to a switch-mode power supply, according to one example embodiment of the present disclosure.

FIG. 2 illustrates a system where a power supply 200 includes an I-squared-C ($I^2C$) bus communication interface 214 for receiving a constant current limit from a user 224 via a computer 222. The interfaces 114 and 214 may include any suitable interface (e.g., external interface) for receiving a current setting from a user, such as a power management bus (PMBus), a Modbus RS485 interface, a universal serial bus (USB), a wire, a connector, a terminal, etc.

As shown in FIG. 2, a control circuit 216 performs an inverse calculation of a constant current (CC) limit input by the user 224 using an iterative loop process, and uses the determined raw digital value from the iterative loop process to set a current reference 218 of the power supply 200. The current reference setting is then used for supplying current to a load 220.

Figure 3A:
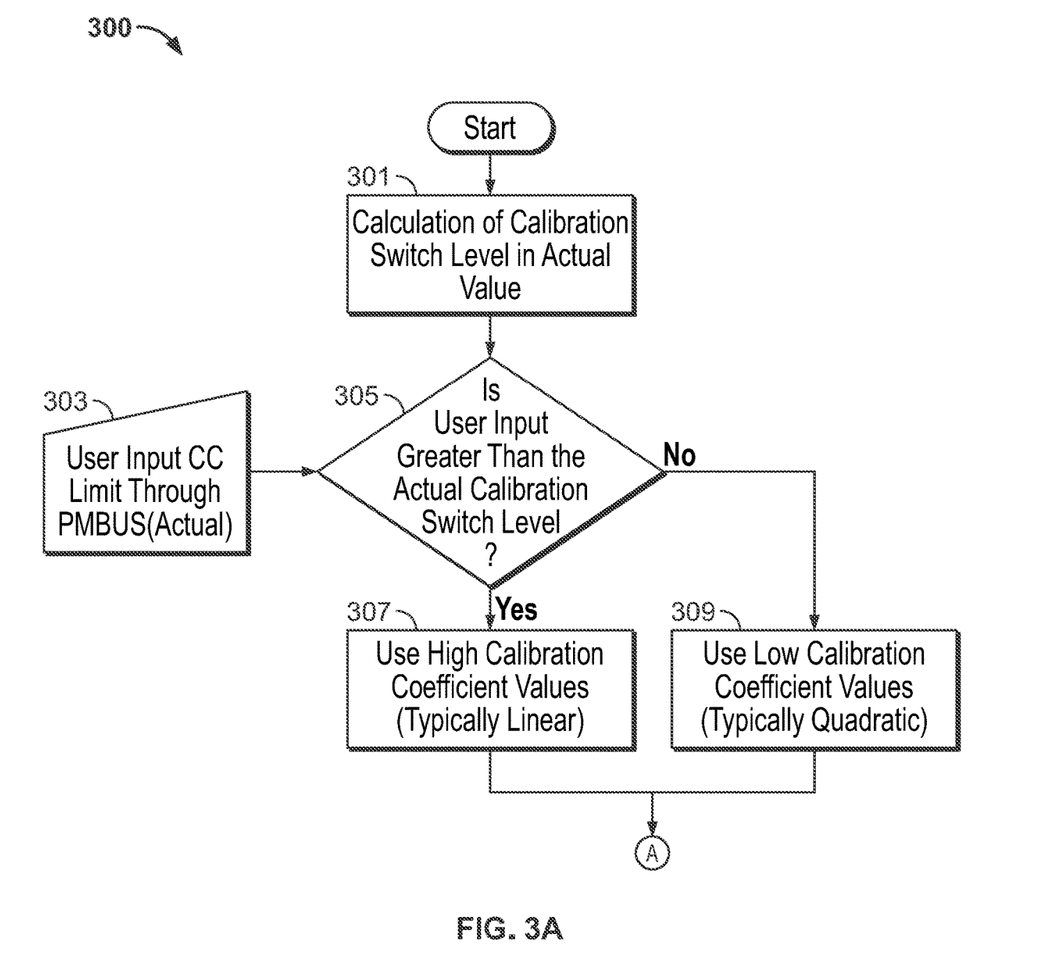
FIGS. 3A and 3B are a flow chart of an example process for determining a raw digital value of an analog-to-digital converter (ADC) that corresponds to a user configurable current setting, according to yet another example embodiment of the present disclosure.
Figure 3B:
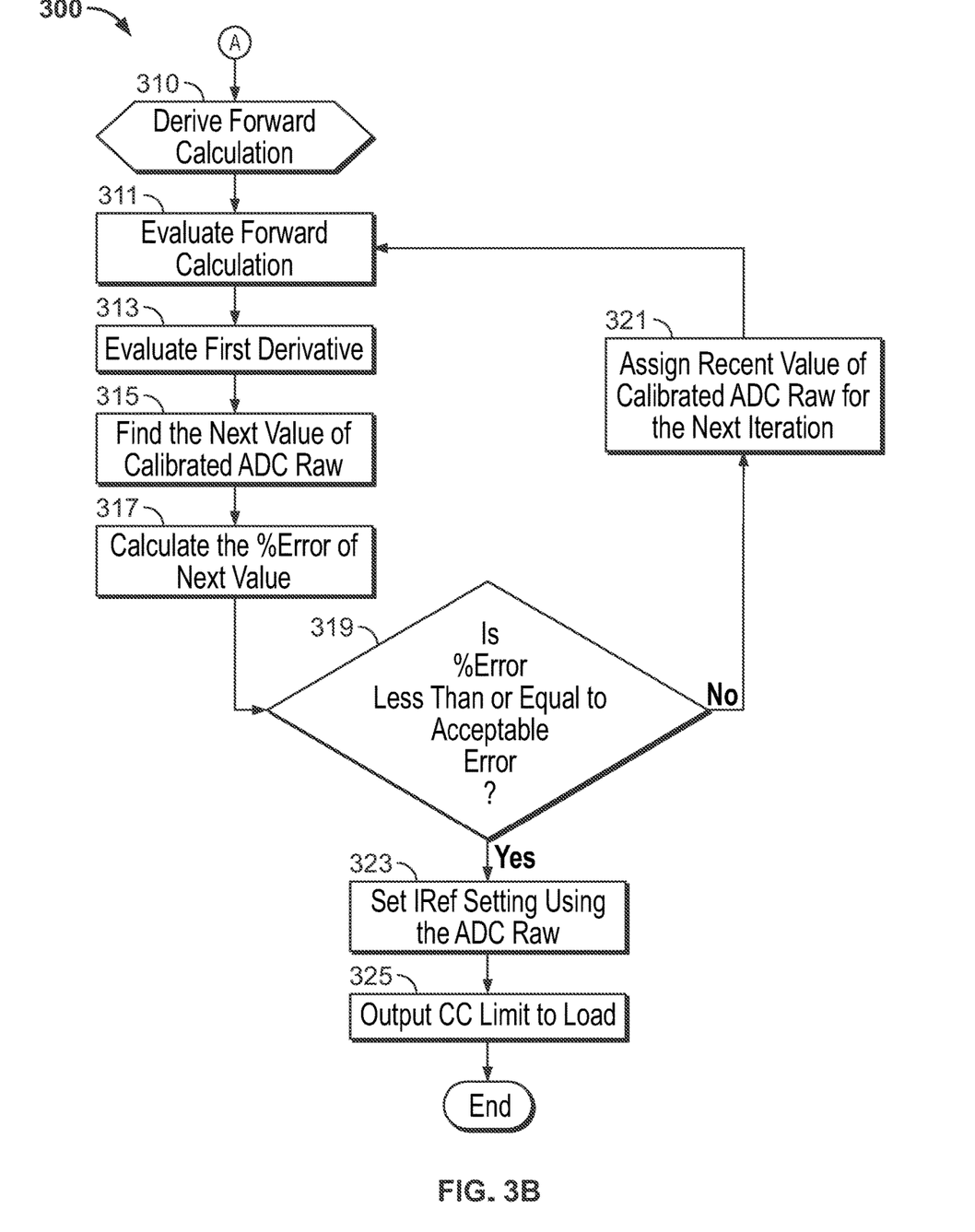
Figure 4:
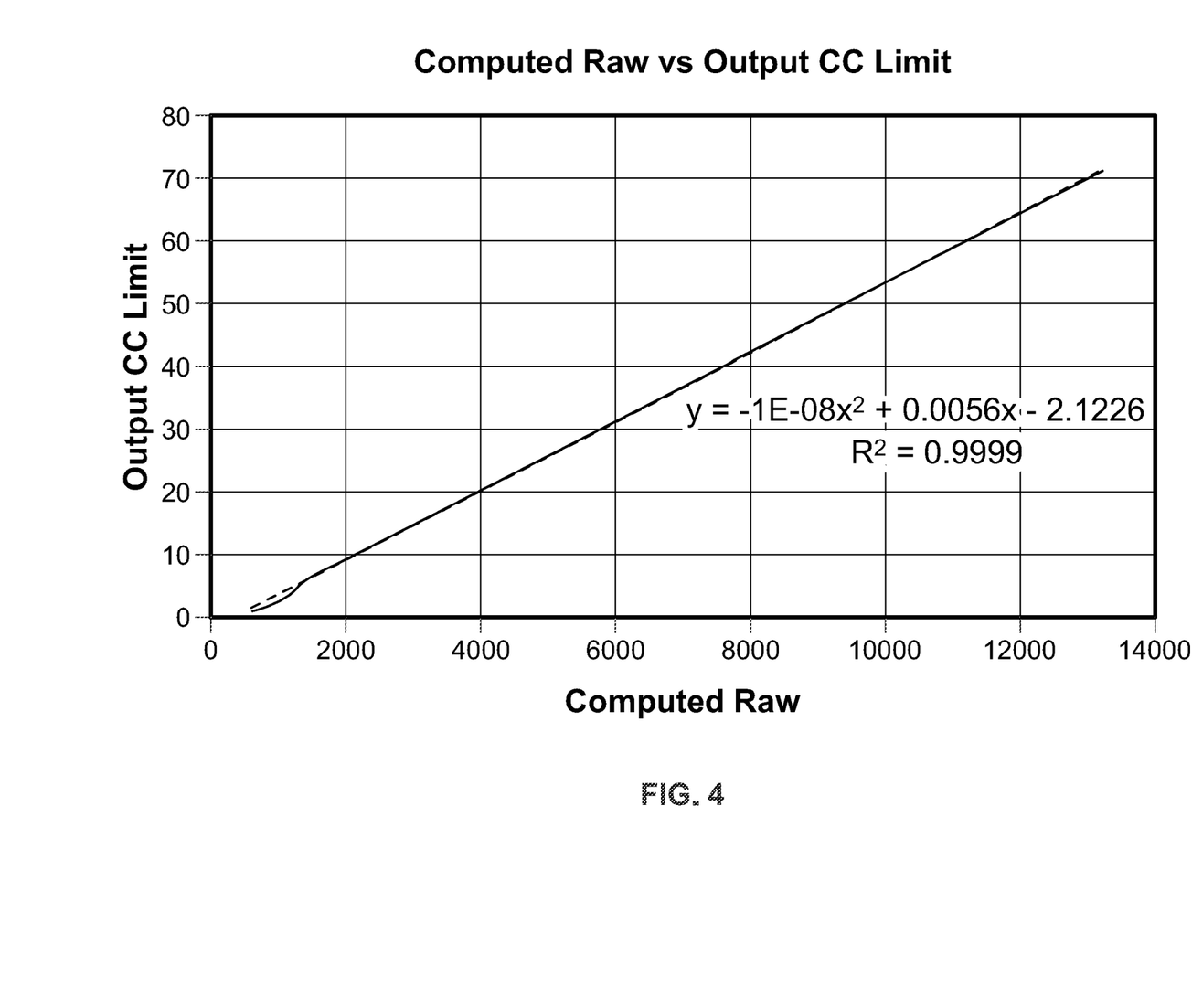
FIG. 4 is a graph of an example output current limit value relative to a computed raw digital value of an ADC.

FIGS. 3A and 3B illustrate an example iterative loop process 300 for determining a digital raw value of an ADC that corresponds to a user input current setting. For example, the process 300 may be implemented by the control circuit 116 of the power supply 100 of FIG. 1, etc.

The process optionally determines a calibration switch level corresponding to an actual current value, at 301. A response of an ADC (e.g., the ADC 112 of FIG. 1, etc.) may have different profiles at different ranges of sensed current. For example, an ADC may output raw digital values that have an approximately quadratic relationship to analog current inputs in a lower current range, and output raw digital values that have an approximately linear relationship to analog current input in a higher current range. The calibration switch level may be an analog current value where the quadratic relationship transitions to the linear relationship. This point may be determined by creating a calibration relationship profile of ADC and then searching for a transition point (e.g., during manufacture of the power supply, etc.).

The process receives a user input of a configurable current setting (e.g., a constant current limit, etc.) via an interface at 303. The process determines whether the user input setting is greater than the calibration switch level at 305, and if so, proceeds to select calibration coefficient values corresponding to the profile above the calibration switch level at 307. If the user input setting is less than the calibration switch level (e.g., the user selects a current setting that is lower than the analog current value where the ADC changes its response profile), the process selects calibration coefficient values corresponding to the profile below the calibration switch level at 309.

Although FIG. 3A illustrates two calibration profiles where the profile above the calibration switch level includes linear calibration coefficients and the profile below the calibration switch level includes quadratic coefficients, other embodiments may include more or less than two profiles. For example, if the ADC response has a single profile, steps 301, 305, 307 and 309 may be omitted, because the process may use a single set of calibration coefficients for all user input settings. Also, other embodiments may include linear and quadratic profiles for higher and lower user input ranges, may include profiles other than linear and quadratic, etc.

FIG. 3B illustrates the iterative loop of the process 300. At 310, a forward calculation is derived, which may include translating a general calibration equation to include the user input current setting. Using the coefficients in the example Table 1 below, the general calibration equation may have the form $A_2X^2+A_1X+A_0$. The values may use fractional integers, such as $A_2$ divided by $2^{31}$, $A_1$ divided by $2^{15}$ etc. The general calibration equation may be modified to incorporate the user input current setting, which may be multiplied by a specified multiplication factor to generate a forward calculation. For example, if the multiplication factor is 400 and the user input setting is 3 Amps, a value of $Y_{user}$ may be 1201 (with possible rounding due to fractional values, etc.). The $Y_{user}$ value may be substituted into the general calibration equation, to give a translated forward calculation of $Y_{new}=A_2X^2+A_1X+A_0-Y_{user}$. The forward calculation values in Table 2 below are based on the $Y_{new}$ equation.

The iterative loop includes a forward calculation at 311. The forward calculation may include substituting an initial raw digital value (X) of the ADC into a calibration equation (e.g., as specified by selecting the appropriate calibration coefficients at 307 or 309 in FIG. 3A), in order to determine an actual sensed current value (Y) that corresponds to the initial raw digital value of the ADC. The initial raw digital value may be selected as a starting point for the iterative loop process, such as a digital value of 32767, etc.

After determining the actual current value at 311, the method 300 proceeds to evaluate a first derivative at 313. The first derivative function may determine a slope (M) of the calibration equation using the initial raw digital value (X). The slope corresponds to a linear relationship $Y_{new}=M(X-X_0)$, where $X_0$ represents an offset or x-intercept. A back calculation equation may be $X_0=X-(Y_{new}/M)$.

The slope (M) may be determined by evaluating and/or substituting coefficients in a first derivative of a quadratic equation. For example, if the calibration coefficients are A2, A1 and A0 for a quadratic equation as shown in Table 1 below (which may be stored in a memory), a first derivative may be equal to $2A_2X+A_1$.

TABLE 1

| ADC Raw (X) | A2 | A1 | A0 | Forward Calculation (Input × Multiplier) | First Derivative (Slope) |
|---|---|---|---|---|---|
| 1038 | 3693545 | −31441 | 343 | 1201 (3 × 400) | −31438 |

As one example, a back calculation process for determining an equivalent ADC Raw for 3 Amps is illustrated in Table 2 below. The process starts with an initial $X_{current}$ value of 32767 (which may be specified as any arbitrary initial value, may be specified to an initial value that reduces the number of iterations required for the most common user input settings, etc.).

A next raw digital value (X) of the ADC is determined at 315, based on the evaluation of the first derivative at 313. For example, the determined next raw digital value (X) may be a closer approximation to a raw digital value that will correspond to the user's input current setting, based on the ADC response. The first derivative for the 3 Amps example, using the coefficients of Table 1 above, is 16235. By evaluating the formula $X_{next}=X_{current}-(Y_{new}/M)$, a next ADC Raw (X) value is determined as 16532, as shown in Table 2 below.

An error percentage (or absolute difference) is calculated between the initial raw digital value (X) and the determined next raw digital value (X), at 317. For example, the error percentage may be a percentage of an absolute value of the difference between the initial raw digital value (X) and the determined next raw digital value (X). Using the above example, an error between the $X_{next}$ and the $X_{current}$ values is compared to a specified acceptable error percentage (e.g., 0.01%, etc.). In Table 2 below, absolute differences between $X_{next}$ and $X_{current}$ are listed, represented as fractional integers.

If the error is greater than a specified error threshold at 319, the determined next raw digital value (X) is assigned as the current raw digital value (X) for a next iteration of the loop at 321. For example, the forward calculation will be performed again at 311 using the most recent determined raw digital value (X) instead of the initial raw digital value (X). This process will be repeated over and over so that subsequent determined raw digital values get closer and closer to the specified acceptable error threshold.

Using the above example, and as shown in Table 2 below, for a next iteration $X_{current}$ is set to 16532, and the value $X_{next}$ is determined to be 8423. The process is repeated with iterative loops until an error is less than the specified acceptable error threshold. As shown in Table 2 below, after the ninth iteration the resulting ADC Raw value for the 3 Amps example is 1038.

TABLE 2

| Iteration | $X_{current}$ | Forward Calculation (using $Y_{new}$) | First Derivative (Slope) | $X_{next} = X_{current} - (Y_{new}/M)$ | Error (as a fractional integer) |
|---|---|---|---|---|---|
| 1st | 32767 | 1814412 | 112 | 16532 | 322 |
| 2nd | 16532 | 453355 | 56 | 8423 | 315 |
| ... | ... | ... | ... | ... | ... |
| 9th | 1038 | 0 | 3 | 1038 | 0 |

If the error is less than or equal to the specified acceptable error threshold at 319, the method 300 proceeds to set a current reference of the power supply using the most recent determined raw digital value at 323. For example, once the iterative loop reaches a determined raw digital value having a percentage error less than or equal to the threshold, the method 300 may infer that the most recent determined raw digital value corresponds approximately (e.g., within the specified error threshold) to the user's current setting based on the ADC response.

The method 300 then outputs a current to the load at 325, using a constant current limit that should approximately correspond to the user's current limit setting (e.g., due to the appropriate current reference set at 323). The specified error percentage may be any suitable percentage that provides a desired approximation to the input current setting, such as 0.01%, a fractional ADC equivalent value of 4, etc. The specified error percentage may be stored in memory, such as a PMBus register.

Tables 3 and 4 below illustrate example calibration coefficient values for an example power supply, and an example calibration switch level. The coefficient values may be determined via a calibration process during manufacture of the power supply, etc. Table 3 lists coefficients A2, A1 and A0 in fraction form for a digital controller calculation, where real world values for A2 may be A2/2^31 and for A1 may be A1/2^15. The multiplier may affect the magnitude of resolutions in computation by the digital controller, and may be set during manufacture of the power supply, etc.

TABLE 3

| Calibration Coefficient Values | | | | |
|---|---|---|---|---|
| Definition | A2 | A1 | A0 | MULTIPLIER |
| High Coefficient Values | 0 | 71873 | 607 | 400 |
| Low Coefficient Values | 3693645 | −31441 | 343 | 400 |

TABLE 4

| Definition | ADC Raw | Actual Value |
|---|---|---|
| Switch Level | 1463 | 7 Amps |

Table 5 below illustrates example results for inputting different constant current limits by the user. The final computed raw digital value (X) for the ADC that corresponds to the user input is listed in the second column, along with the execution time, the resulting actual output constant current limit based on the computed raw digital value (X), and the percentage error. The type of linearization is illustrated in the final column, where the ADC response profile changes from a quadratic relationship to a linear one around the calibration switch level value of seven amps.

TABLE 5

| User Input CC Limit | Computed Raw | Execution Time(μS) | Output CC Limit | % Error | Type of Linearization |
|---|---|---|---|---|---|
| 1 | 612 | 32266 | 0.999942824 | 0.005718% | Quadratic |
| 2 | 865 | 30225 | 1.999855154 | 0.007242% | $Y = A_2X^2 + A_1X + A_0$ |
| 3 | 1038 | 25430 | 3.00702097 | 0.234032% | Where: |
| 4 | 1178 | 23953 | 3.998674701 | 0.033132% | X = Computed Raw |
| 5 | 1299 | 19867 | 4.997189856 | 0.056203% | Y = User Input CC Limit |
| 6 | 1407 | 21864 | 5.994773349 | 0.087111% | Linear |
| 7 | 1554 | 11939 | 7.004079791 | 0.058283% | $Y = A_1X + A_0$ |
| 8 | 1736 | 12691 | 8.002102649 | 0.026283% | Where: |
| 9 | 1918 | 11923 | 9.000125507 | 0.001395% | X = Computed Raw |
| 10 | 2101 | 14043 | 10.00363201 | 0.036320% | Y = User Input CC Limit |
| 11 | 2283 | 14101 | 11.00165487 | 0.015044% | |
| 12 | 2465 | 14212 | 11.99967772 | 0.002686% | |
| 13 | 2648 | 13340 | 13.00318422 | 0.024494% | |
| 14 | 2830 | 12045 | 14.00120708 | 0.008622% | |
| 15 | 3012 | 9819 | 14.99922994 | 0.005134% | |
| 16 | 3194 | 10125 | 15.9972528 | 0.017170% | |
| 17 | 3377 | 13284 | 17.0007593 | 0.004466% | |
| 18 | 3559 | 10066 | 17.99878216 | 0.006766% | |
| 19 | 3741 | 9884 | 18.99680502 | 0.016816% | |
| 20 | 3924 | 9923 | 20.00031152 | 0.001558% | |
| 21 | 4106 | 11323 | 20.99833438 | 0.007932% | |
| 22 | 4288 | 8591 | 21.99635723 | 0.016558% | |
| 23 | 4471 | 9940 | 22.99986373 | 0.000592% | |
| 24 | 4653 | 11322 | 23.99788659 | 0.008806% | |
| 25 | 4835 | 11305 | 24.99590945 | 0.016362% | |

TABLE 5-continued

| User Input CC Limit | Computed Raw | Execution Time(μS) | Output CC Limit | % Error | Type of Linearization |
|---|---|---|---|---|---|
| 26 | 5018 | 9942 | 25.99941595 | 0.002246% | |
| 27 | 5200 | 10693 | 26.99743881 | 0.009486% | |
| 28 | 5382 | 10002 | 27.99546167 | 0.016208% | |
| 29 | 5565 | 10126 | 28.99896817 | 0.003558% | |
| 30 | 5747 | 8543 | 29.99699103 | 0.010030% | |
| 31 | 5930 | 11292 | 31.00049753 | 0.001605% | |
| 32 | 6112 | 9940 | 31.99852039 | 0.004624% | Linear |
| 33 | 6294 | 12059 | 32.99654324 | 0.010475% | $Y = A_1 X + A_0$ |
| 34 | 6477 | 11291 | 34.00004975 | 0.000146% | Where: |
| 35 | 6659 | 11280 | 34.9980726 | 0.005507% | X = Computed Raw |
| 36 | 6841 | 11323 | 35.99609546 | 0.010846% | Y = User Input CC Limit |
| 37 | 7024 | 11340 | 36.99960196 | 0.001076% | |
| 38 | 7206 | 8512 | 37.99762482 | 0.006250% | |
| 39 | 7389 | 11280 | 39.00113132 | 0.002901% | |
| 40 | 7571 | 9987 | 39.99915418 | 0.002115% | |
| 41 | 7753 | 11382 | 40.99717704 | 0.006885% | |
| 42 | 7936 | 8526 | 42.00068354 | 0.001627% | |
| 43 | 8118 | 10002 | 42.9987064 | 0.003008% | |
| 44 | 8300 | 8469 | 43.99672926 | 0.007434% | |
| 45 | 8483 | 11310 | 45.00023576 | 0.000524% | |
| 46 | 8665 | 10157 | 45.99825861 | 0.003786% | |
| 47 | 8847 | 12075 | 46.99628147 | 0.007912% | |
| 48 | 9030 | 8434 | 47.99978797 | 0.000442% | |
| 49 | 9212 | 12030 | 48.99781083 | 0.004468% | |
| 50 | 9395 | 10060 | 50.00131733 | 0.002635% | |
| 51 | 9577 | 11323 | 50.99934019 | 0.001294% | |
| 52 | 9759 | 11312 | 51.99736305 | 0.005071% | |
| 53 | 9942 | 8558 | 53.00086955 | 0.001641% | |
| 54 | 10124 | 9850 | 53.99889241 | 0.002051% | |
| 55 | 10306 | 10600 | 54.99691527 | 0.005609% | |
| 56 | 10489 | 11414 | 56.00042177 | 0.000753% | |
| 57 | 10671 | 9864 | 56.99844462 | 0.002729% | |
| 58 | 10854 | 10617 | 58.00195112 | 0.003364% | |
| 59 | 11036 | 11399 | 58.99997398 | 0.000044% | |
| 60 | 11218 | 10584 | 59.99799684 | 0.003339% | |
| 61 | 11401 | 11275 | 61.00150334 | 0.002464% | |
| 62 | 11583 | 8527 | 61.9995262 | 0.000764% | Linear |
| 63 | 11765 | 10664 | 62.99754906 | 0.003890% | $Y = A_1 X + A_0$ |
| 64 | 11948 | 11276 | 64.00105556 | 0.001649% | Where: |
| 65 | 12130 | 8543 | 64.99907842 | 0.001418% | X = Computed Raw |
| 66 | 12312 | 9955 | 65.99710128 | 0.004392% | Y = User Input CC Limit |
| 67 | 12495 | 11308 | 67.00060778 | 0.000907% | |
| 68 | 12677 | 8528 | 67.99863063 | 0.002014% | |
| 69 | 12860 | 11568 | 69.00213713 | 0.003097% | |
| 70 | 13042 | 11372 | 70.00015999 | 0.000229% | |
| 71 | 13224 | 8496 | 70.99818285 | 0.002559% | |

Figure 5:
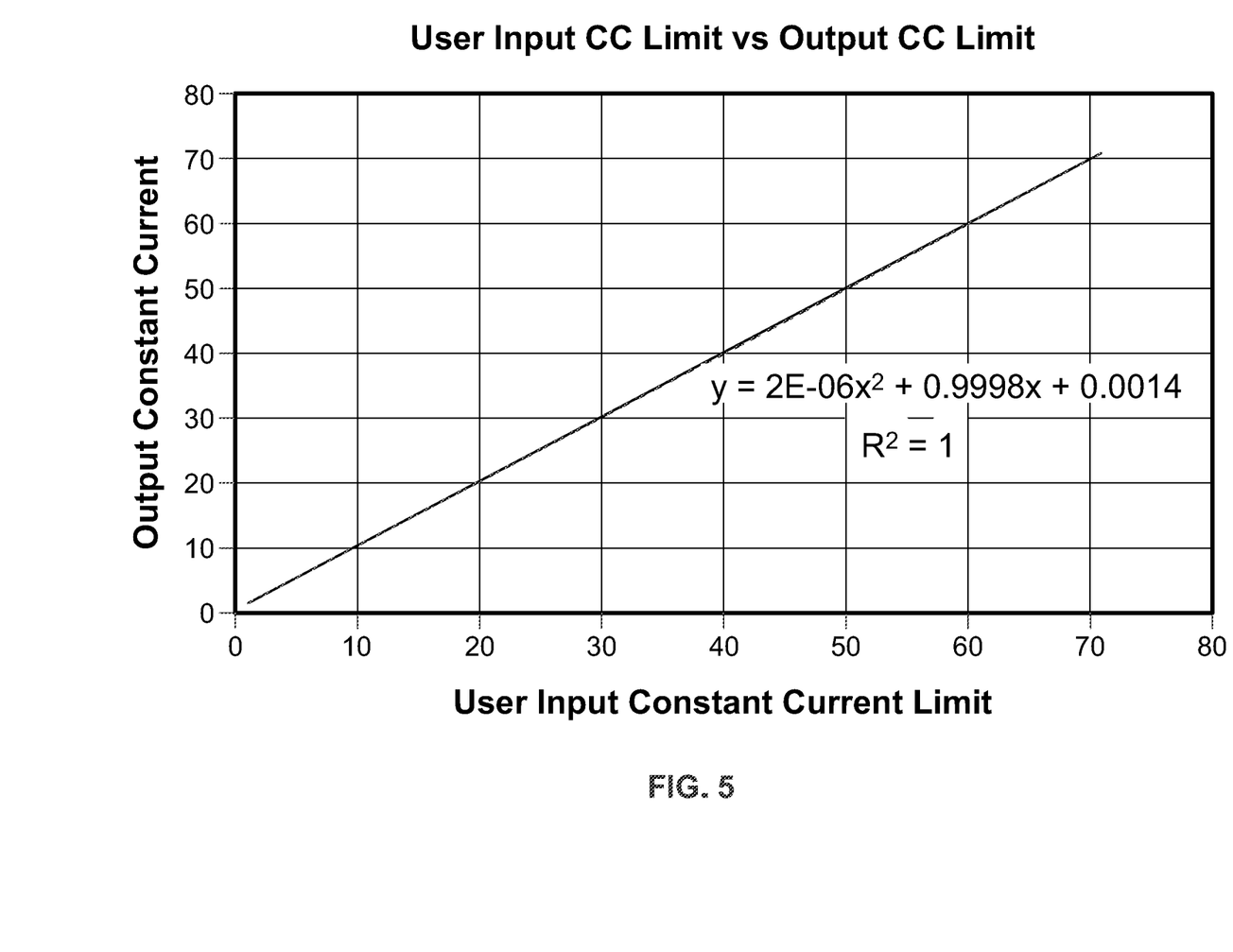
FIG. 5 is a graph of an example output current limit value relative to a user input configurable current setting.

FIGS. 5 and 6 illustrate example waveforms of the output constant current limit with respect to the computed raw digital value, and the output constant current with respect to the user input setting. As shown in FIG. 5, there is an approximately quadratic relationship below the calibration switch level of seven amps, and an approximately linear relationship above the calibration switch level. FIG. 6 illustrates a very close approximation for the output constant current based on the user input setting, using the iterative loop process.

According to another aspect of the present disclosure, a method of controlling a switch-mode power supply is disclosed. The power supply includes a pair of input terminals for receiving an alternating current (AC) or direct current (DC) voltage input from an input power source, a pair of output terminals for supplying a direct current (DC) voltage output to a load, at least one switch coupled between the pair of input terminals and the pair of output terminals, an analog-to-digital converter (ADC) coupled to convert a sensed analog current value at the pair of output terminals to a raw digital value, and an external interface.

The method includes, receiving, via the external interface, a user configurable current setting, and processing an iterative loop to determine a raw digital value of the ADC that corresponds to the received current setting. The method also includes turning on and turning off the at least one switch according to the determined raw digital value setting to supply an output current at the pair of output terminals that corresponds to the received current setting.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A control circuit for a switch-mode power supply including a switch coupled between a power supply input and a power supply output and an analog-to-digital converter (ADC), the control circuit configured to:

process an iterative loop to determine a raw digital value of the ADC that corresponds to a received user configurable current setting;

turn on and turn off the switch based on the determined raw digital value and an output digital value of the ADC to supply an output current at the power supply output that corresponds to the received current setting.

2. The control circuit of claim 1, wherein the control circuit is further configured to receive the user configurable current setting via one of a power management bus (PM-Bus), an I-squared-C ($I^2C$) communication bus, and a Modbus RS485 interface.

3. The control circuit of claim 1, wherein the control circuit is further configured to receive the user configurable current setting via an external interface.

4. The control circuit of claim 1, wherein the control circuit is configured to determine the raw digital value by processing the iterative loop without solving a quadratic equation.

5. The control circuit of claim 1, wherein the control circuit is configured to determine the raw digital value by processing the iterative loop without using a look up table that stores raw digital values corresponding to user configurable current settings.

6. The control circuit of claim 1, wherein the control circuit is configured to process the iterative loop by using a forward calculation that determines a test output current value by substituting a test raw digital value into a calibration equation that includes multiple specified calibration coefficients.

7. The control circuit of claim 6, wherein the control circuit is configured to process the iterative loop by using a derivative calculation that determines a slope of the calibration equation using the test raw digital value.

8. The control circuit of claim 7, wherein the control circuit is configured to:

process the iterative loop to determine a next raw digital value according to the determined slope of the calibration equation; and calculate a percent error of the determined next raw digital value.

9. The control circuit of claim 8, wherein, in response to the calculated percent error being greater than a specified acceptable error threshold, the control circuit is configured to process the iterative loop to repeat the iterative loop with the determined next raw digital value assigned as the test raw digital value in the forward calculation of the repeated loop.

10. The control circuit of claim 8, wherein, in response to the calculated percent error being less than the specified acceptable error threshold, the control circuit is configured to process the iterative loop to set a current reference of the power supply according to the determined next raw digital value.

11. The control circuit of claim 6, wherein the control circuit comprises a fixed-point digital signal processor that is only capable of performing calculations on integer numbers.

12. The control circuit of claim 11, wherein:

the calibration equation is a first calibration equation corresponding to a first range of user configurable current settings, the first calibration equation including a first set of the multiple specified calibration coefficients;

the forward calculation further includes a second calibration equation corresponding to a first range of user configurable current settings, the second calibration equation including a second set of the multiple specified calibration coefficients;

the control circuit is configured to process the iterative loop using the first calibration equation when the received user configurable current setting is in the first range; and the control circuit is configured to process the iterative loop using the second calibration equation when the received user configurable current setting is in the second range.

13. The control circuit of claim 12, wherein the first range is separated from the second range according to a current setting switch point that corresponds to a change in the analog-to-digital response of the ADC.

14. The control circuit of claim 12, wherein:

the first calibration equation comprises a quadratic equation;

the second calibration equation comprises a linear equation; and the first range of current settings is less than the second range of current settings.

15. The control circuit of claim 1, wherein the control circuit is configured to set a constant current limit of the switch-mode power supply according to the user configurable current setting.

16. A method of controlling a switch-mode power supply including an input, an output, at least one switch coupled between the input and the output, and an analog-to-digital converter (ADC), the method comprising:

receiving a user configurable current setting;

processing an iterative loop to determine a raw digital value of the ADC that corresponds to the received current setting; and turning on and turning off the at least one switch based on the determined raw digital value and an output digital value of the ADC to supply an output current at the output that corresponds to the received current setting.

17. The method of claim 16, wherein processing the iterative loop comprises processing the iterative loop without solving a quadratic equation.

18. The method of claim 16, wherein processing the iterative loop comprises processing the iterative loop without using a look up table that stores raw digital values corresponding to user configurable current settings.

19. The method of claim 16, wherein processing the iterative loop comprises using a forward calculation to determine a test output current value by substituting a test raw digital value into a calibration equation that includes multiple specified calibration coefficients.

20. The method of claim 19, wherein processing the iterative loop comprises processing using a derivative calculation to determine a slope of the calibration equation using the test raw digital value.

* * * * *